United States Patent
Shoemaker et al.

(10) Patent No.: US 9,627,357 B2
(45) Date of Patent: Apr. 18, 2017

(54) STACKED MEMORY ALLOWING VARIANCE IN DEVICE INTERCONNECTS

(75) Inventors: Kenneth Shoemaker, Los Altos Hills, CA (US); Pete Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 489 days.

(21) Appl. No.: 13/997,152

(22) PCT Filed: Dec. 2, 2011

(86) PCT No.: PCT/US2011/063190
§ 371 (c)(1),
(2), (4) Date: Jun. 21, 2013

(87) PCT Pub. No.: WO2013/081633
PCT Pub. Date: Jun. 6, 2013

(65) Prior Publication Data
US 2013/0292840 A1 Nov. 7, 2013

(51) Int. Cl.
*H01L 25/00* (2006.01)
*H01L 25/065* (2006.01)
(Continued)

(52) U.S. Cl.
CPC ...... *H01L 25/0657* (2013.01); *H01L 25/0652* (2013.01); *H01L 25/18* (2013.01);
(Continued)

(58) Field of Classification Search
CPC .................................................. H01L 23/48
See application file for complete search history.

(56) References Cited

U.S. PATENT DOCUMENTS

| 6,034,438 A | 3/2000 | Petersen |
| 6,133,640 A | 10/2000 | Leedy |

(Continued)

FOREIGN PATENT DOCUMENTS

| CN | 101017813 | 8/2007 |
| CN | 201060393 | 5/2008 |

(Continued)

OTHER PUBLICATIONS

Gabriel H. Loh, "3D-Stacked Memory Architectures for Multi-Core Processors", International Symposium on Computer Architecture, 2008 IEEE, pp. 453-464.

(Continued)

*Primary Examiner* — William Harriston
(74) *Attorney, Agent, or Firm* — Blakely, Sokoloff, Taylor & Zafman LLP

(57) ABSTRACT

A stacked memory allowing variance in device interconnects. An embodiment of a memory device includes a system element for the memory device, the system element including multiple pads, and a memory stack connected with the system element, the memory stack having one or more memory die layers, a connection of the system element and the memory stack including interconnects for connecting a first memory die layer and the plurality of pads of the system element. For a single memory die layer in the memory stack, a first subset of the plurality of pads is utilized for a first group of interconnects for the connection of the system element and the memory stack, and for two or more memory die layers, the first subset and an additional second subset of the plurality of pads are utilized for the first group of interconnects and a second group of interconnects for the connection of the system element and the memory stack.

12 Claims, 7 Drawing Sheets

(51) Int. Cl.
  *H01L 27/108* (2006.01)
  *H01L 25/18* (2006.01)
  *H01L 23/48* (2006.01)
  *H01L 23/14* (2006.01)
(52) U.S. Cl.
  CPC ...... *H01L 27/108* (2013.01); *H01L 27/10897* (2013.01); *H01L 23/147* (2013.01); *H01L 23/481* (2013.01); *H01L 27/10882* (2013.01); *H01L 2225/06527* (2013.01); *H01L 2225/06541* (2013.01); *H01L 2225/06565* (2013.01); *H01L 2924/0002* (2013.01)

(56) References Cited

U.S. PATENT DOCUMENTS

| | | | |
|---|---|---|---|
| 6,423,572 | B1 | 7/2002 | Shiflet |
| 7,123,497 | B2 | 10/2006 | Matsui et al. |
| 2004/0232559 | A1* | 11/2004 | Adelmann .......... H01L 23/3128 257/777 |
| 2005/0286334 | A1 | 12/2005 | Saito et al. |
| 2008/0080261 | A1 | 4/2008 | Shaeffer et al. |
| 2009/0244874 | A1 | 10/2009 | Mahajan et al. |
| 2010/0007001 | A1 | 1/2010 | Wang et al. |
| 2010/0008058 | A1 | 1/2010 | Saen et al. |
| 2010/0078790 | A1 | 4/2010 | Ito et al. |
| 2011/0050320 | A1 | 3/2011 | Gillingham |
| 2011/0194369 | A1 | 8/2011 | Jeddeloh |
| 2011/0208906 | A1 | 8/2011 | Gillingham |
| 2011/0249483 | A1 | 10/2011 | Oh et al. |

FOREIGN PATENT DOCUMENTS

| | | |
|---|---|---|
| CN | 101950745 | 1/2011 |
| CN | 102770920 | 11/2011 |
| JP | 10150120 | 6/1998 |
| JP | 2003163326 | 6/2003 |
| JP | 2008-251917 | 10/2008 |
| JP | 2010524089 | 7/2010 |
| JP | 2011515842 | 5/2011 |
| JP | 11345908 | 12/2016 |
| TW | 201027692 | 7/2010 |
| WO | WO-2011/107612 | 9/2011 |

OTHER PUBLICATIONS

International Search Report and Written Opinion of the International Searching Authority mailed Aug. 22, 2012, in International Application No. PCT/US2011/063190, 10 pages.
Official Letter dated Nov. 12, 2014 (+ English translation), in Taiwan Patent Application No. 101142189, 9 pages.
Official Communication dated Nov. 11, 2015 (+ English translation), in German Patent Application No. 11 2011 105 905.1, 18 pages.
Notice of Reasons for Rejection dated Sep. 15, 2015 (+ English translation), in Japanese Patent Application No. 2014-544715, 6 pages.
First Office Action dated Jun. 25, 2015 (+ English translation), in Taiwan Patent Application No. 101142189, 5 pages.
English Translation of First Office Action mailed Dec. 25, 2016, Chinese Patent Application No. 201180075219.2, 17 pages.
English Translation of Chinese Search Report mailed on Dec. 25, 2016, Chinese Patent Application No. 201180075219.2, 3 pages.
Decision to Grant in German Application No. 112011105905.1 mailed Jun. 20, 2016, 12 pages.
Second Office Action in Chinese Application No. 201180075219.2 mailed Aug. 8, 2016, 3 pages.
Decision to Grant in Japanese Application No. 2014-544715 mailed on May 10, 2016, 1 page.
Third Office Action in Chinese Application No. 201180075219.2 mailed Nov. 16, 2016, 3 pages.

\* cited by examiner

| VSSQ | DQ1 | VDDQ | DQ3 | VSSQ |
|---|---|---|---|---|
| VSSQ | VDD2 | VDDQ | VSS | VSSQ |
| DQ0 | VDD2 | DQ2 | VSS | DQ4 |
| VSSQ | DQ1 | VDDQ | DQ3 | VSSQ |
| VSSQ | VDD2 | VDDQ | VSS | VSSQ |
| DQ0 | VDD2 | DQ2 | VSS | DQ4 |
| VSSQ | DQ1 | VDDQ | DQ3 | VSSQ |
| VSSQ | VDD2 | VDDQ | VSS | VSSQ |
| DQ0 | VDD2 | DQ2 | VSS | DQ4 |
| VSSQ | DQ1 | VDDQ | DQ3 | VSSQ |
| VSSQ | VDD2 | VDDQ | VSS | VSSQ |
| DQ0 | VDD2 | DQ2 | VSS | DQ4 |

Fig. 5

STACKED MEMORY ALLOWING VARIANCE IN DEVICE INTERCONNECTS

TECHNICAL FIELD

Embodiments of the invention generally relate to the field of electronic devices and, more particularly, to a stacked memory allowing variance in device interconnects.

BACKGROUND

To provide memory with higher bandwidth for various kinds of computing operations, memory devices having a plurality of closely coupled memory elements (which may be referred to as 3D stacked memory, or stacked memory) are being developed.

A 3D stacked memory may include coupled layers or packages of DRAM (dynamic random-access memory) memory elements, which may be referred to as a memory stack. Stacked memory may be utilized to provide a great amount of computer memory in a single device or package, where the device or package may further include system components, such as a memory controller and CPU (central processing unit) or other system elements.

However, stacked memory may require a large number of connections in a small physical area. For this reason, the connections may be required to be very small in size, thereby increasing cost and limiting flexibility in manufacturing.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 5 illustrates an embodiment of a pad layout for stacked memory devices supporting varying pitch of interface connections.

DETAILED DESCRIPTION

Figure 1:
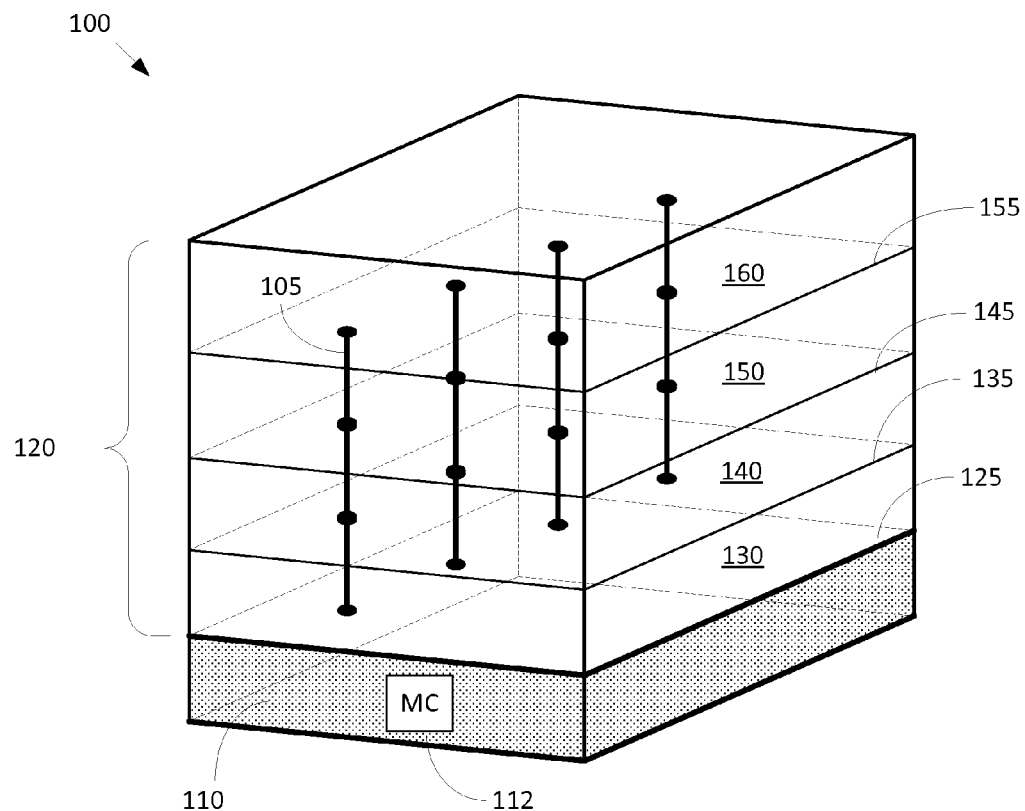
FIG. 1 illustrates an embodiment of a 3D stacked memory.

Embodiments of the invention are generally directed to a stacked memory with interface providing offset interconnects.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a logic chip or a system on chip (SoC).

In some embodiments, an architecture for a stacked memory device provides for a die-to-die memory interface that support multiple different pad pitches depending on the number of memory layers in the stacked memory. In some embodiments, an architecture makes use of a structure of a stacked memory device, by which less than all possible connections pads are utilized when the stacked memory device has fewer than a maximum number of memory layers in a memory stack.

The need for both increased memory bandwidth and increased memory efficiency have has encouraged development of package memories using very wide interfaces. An example of this is the JEDEC WideIO memory standard, which uses 1200 interconnects between the logic chip and the memory (which may generally be referred to as the logic memory interconnect, or LMI). These memory solutions may provide greater memory bandwidth efficiency in comparison with other low-power DRAM technologies such as LPDDR2 or LPDDR3 (Low Power Double Data Rate 2 and 3).

To implement the wide interface with a moderate memory die size impact, fine pitch interfaces (such as 40 μm) may be required. The use of such fine pitches necessitates using silicon-to-silicon connections, where either the memory is stacked directly on system element, thus requiring the use of through silicon vias (TSVs) for the logic chip, or both the memory and the system are mounted on a silicon interposer. However, these arrangements suffer from increased cost requirements associated with the TSV processing of the system element or the inclusion of the silicon interposer in the structure. The very fine pitch interfaces are not compatible with mixed substrate materials, such as the coupling of a silicon die layer with an organic substrate of a system element.

In higher end systems, in order to obtain the required memory capacity with in-package memories, memories stacked with TSVs may be employed in the memory chips. However, this structure increases the cost per bit of the memories. In the example of the WideIO interface, the data lines are buses, where each of the 512 data lines from one memory chip is connected to a corresponding data line of the 512 data lines of all other memory chips, which are then connected with 512 data lines on the memory controller. However, this sharing of the data lines means that the bandwidth of the memory system remains the same regardless of how many memory chips are stacked.

In some embodiments, a different approach for stacking memories utilizes data lines that are not shared. As opposed to the connection of all data lines, while the data lines are passed through each of the memory die layers in the memory stack, each memory die layer only drives a subset (such as one-quarter) of the data lines of the memory device. In this approach, the bandwidth of the memory stack increases as memory die layers are added to the memory stack. In such a device implementation, the entire interface still has a large number of data lines requiring use of fine pitch interconnect for a maximum stack of memory die layers, but each memory chip only drives a subset of the data lines.

The costs involved with developing a memory chip are substantial, and the costs involved in stacking memory chips are also significant. In some embodiments, a single memory design allows for serving lower end, single memory chip memory systems as well as higher end, multiple chip memory systems. The cost per bit of a single memory die layer is less expensive than the cost of a multiple TSV stacked memory "cube" because of the additional processing and yield fall out of memory chip TSV processing and stacking. However, in conventional devices, a single memory chip would still required to employ fine pitch interconnects, necessitating expensive TSV processing in the logic device or expensive silicon interposers.

In some embodiments, a memory device utilizes an architecture allowing for each memory chip to drive a subset (such as one-quarter) of the data lines, allowing for populating only a subset of the mechanical connections on the die using a top-level metal mask change and a change to the DRAM wafer post processing. Because only a subset of the pads are required, in some embodiments organizing the pads of the memory chip yields a pad pitch that can be assembled using, for example, conventional C4 (Controlled Collapse Chip Connection, or Flip Chip) packaging techniques.

In some embodiments, a single memory specification and a single memory chip design may be utilized to support a range of applications. In high end implementations, memory wafers may be processed with an entire fine pitch interface populated and with TSVs developed. The dies may then be singulated and assembled into memory stacks that expose the entire fine pitch memory interface. These memory stacks are then stacked on a system element (logic chip) that is constructed utilizing TSVs. For space constrained designs that need only a single DRAM chip's capacity, memory wafers may be processed and the entire fine pitch interface array populated, but TSVs are not developed. The dies may then be singulated and stacked on a logic chip that is built with TSVs. For cost sensitive applications, memory wafers may be processed, but with only a first subset of the interface array being populated and TSVs not being developed. The dies may then be singulated and assembled in a package, next to a logic chip, using, for example, conventional C4-type assembly techniques.

In some embodiments, a memory device includes a system element for the memory device, the system element including multiple pads, and a memory stack connected with the system element, the memory stack having one or more memory die layers, a connection of the system element and the memory stack including interconnects for connecting a first memory die layer and the plurality of pads of the system element. For a single memory die layer in the memory stack, a first subset of the plurality of pads is utilized for a first group of interconnects for the connection of the system element and the memory stack, and for two or more memory die layers, the first subset and an additional second subset of the plurality of pads are utilized for the first group of interconnects and a second group of interconnects for the connection of the system element and the memory stack. In some embodiments, the first subset of the plurality of pads are spaced such that at least one pad is located between each pad of the first subset of pads. In some embodiments, all of the pads of the plurality of pads are used for interconnects if the number of memory die layers is a maximum number of memory die layers for the memory.

In some embodiments, a first pitch of interconnect is used for the interconnects of the first memory die layer and the system element if the single memory die layer is the sole memory die layer in the memory stack, and a second pitch of interconnect is used for the interconnects of the first memory die layer and the system element if a certain number of memory die layers are present in the memory stack, the certain number being two or greater, the first pitch of interconnect being greater than the second pitch of interconnect.

FIG. 1 illustrates an embodiment of a 3D stacked memory. In this illustration, a 3D stacked memory device 100 includes a system element 110 coupled with one or more DRAM memory die layers 120, also referred to herein as the memory stack. In some embodiments, the system element may be a system on chip (SoC) or other similar element. The elements of this figure and the following figures are presented for illustration, and are not drawn to scale. While FIG. 1 illustrates an implementation in which the system element 110 is coupled below the memory stack of one or more memory die layers 120, embodiments are not limited to this arrangement. For example, in some embodiments a system element 110 may be located adjacent to the memory stack 120, and thus may be coupled in a side-by-side arrangement with the memory stack 120.

In this illustration, the DRAM memory die layers include four memory die layers, these layers being a first memory die layer 130, a second memory die layer 140, a third memory die layer 150, and a fourth memory die layer 160. However, embodiments are not limited to any particular number of memory die layers in the memory stack 110, and may include a greater or smaller number of memory die layers. Among other elements, the system element 110 may include a memory controller 112 for the memory stack 120. In some embodiments, each memory die layer (with the possible exception of the top, or outermost, memory die layer, such as the fourth memory die layer 160 in this illustration) includes a plurality of through silicon vias (TSVs) to provide paths through the silicon substrate of the memory die layers.

In some embodiments, each memory die layer includes an interface for a connection with another die layer or the system element 110. In this illustration, the first memory die layer 130 includes a first interface 125 for the coupling between the first memory die layer 130 and the system element 110; the second memory die layer 140 includes a second interface 135 for the coupling between the second memory die layer 140 and the first memory die layer 130; the third memory die layer 150 includes a third interface 145 for the coupling between the third memory die layer 150 and the second memory die layer 140; and the fourth memory die layer 160 includes a fourth interface 155 for the coupling between the fourth memory die layer 160 and the third memory die layer 150.

In some embodiments, the stacked memory device 100 is structured such that each memory die drives a subset of the logic memory interconnect, and the structure is utilized to allow for variation in pitch for interconnects between the memory stack and the system element 110. In some embodiments, the stacked memory device 100 provides for interconnect pad placement that are spaced to allow for variation in pitch of interconnects with variation in a number of memory die layers in the memory stack.

Figure 2:
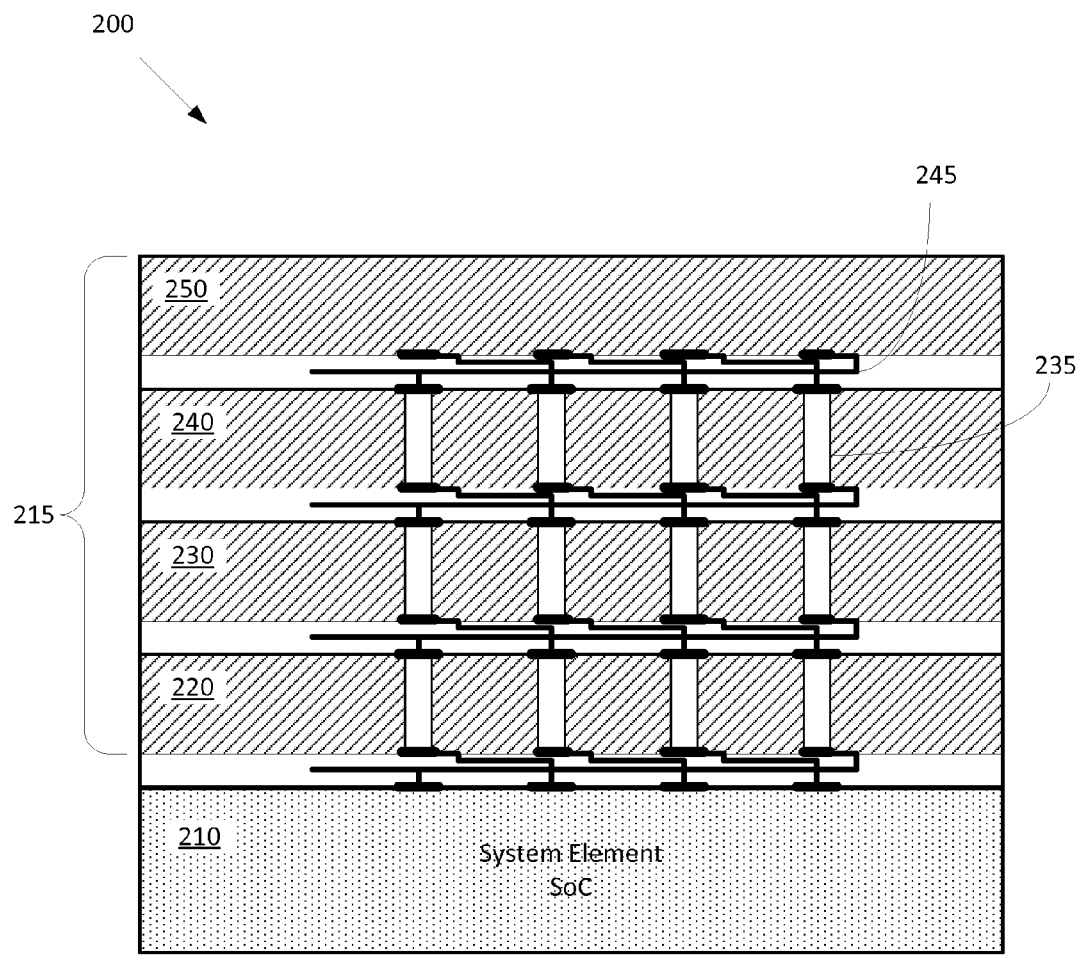
FIG. 2 illustrates elements of an embodiment of a stacked memory device.

FIG. 2 illustrates elements of an embodiment of a stacked memory device. In some embodiments, a stacked memory device 200 includes a memory stack 215, where the memory stack in this illustration has four memory die layers, a first memory die layer 220, a second memory die layer 230, a third memory die layer 240, and a fourth memory die layer 250. In this illustration, the memory stack is coupled to a system element 210 (which may also be referred to as a logic chip), which may be a system on chip or similar element. While the memory stack is shown coupled directly with the system element 210, in other implementations the elements may be coupled in a different manner, where, for example, both the memory stack 215 and the system element 210 may be coupled with a silicon interposer between the memory stack and the system element 210.

As shown in FIG. 2, the memory die layers 215 may include through silicon vias 235 to provide signal paths through the memory die layers and interfaces between the memory die layers 215, or between a memory die layer 220 and the system element 210.

In some embodiments, the stacked memory device 200 is structured such that each memory die drives a subset of the logic memory interconnect, and the structure is utilized to allow for variation in pitch for interconnects between the memory stack and the system element 210. In this illustration providing four memory die layers, the device 200 may be structured such that each memory die layer drives one-quarter of the memory interconnect. In some embodiments, the stacked memory device 200 provides for interconnect pad placement that are spaced to allow for variation in pitch of interconnects with variation in a number of memory die layers in the memory stack.

Figure 3A:
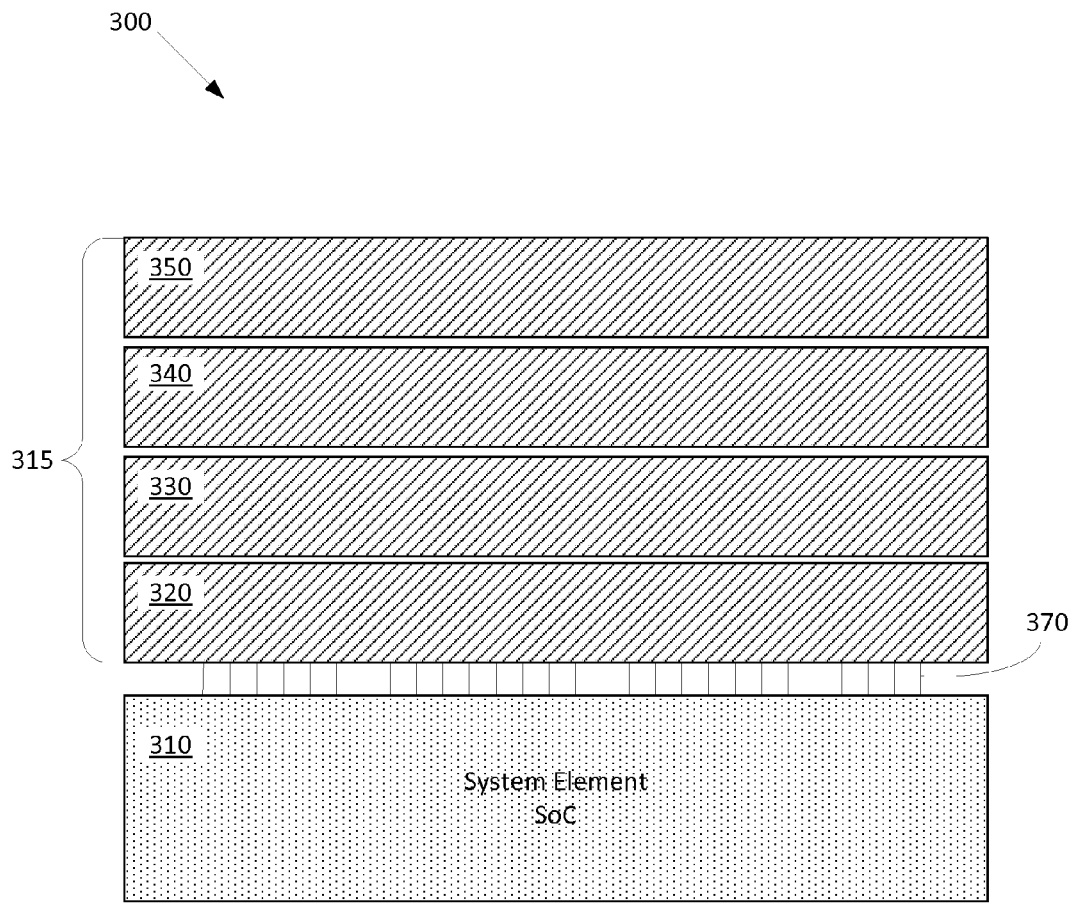
FIGS. 3A, 3B, and 4 illustrate connections for embodiments of a stacked memory device having varying numbers of memory die layers.
Figure 3B:
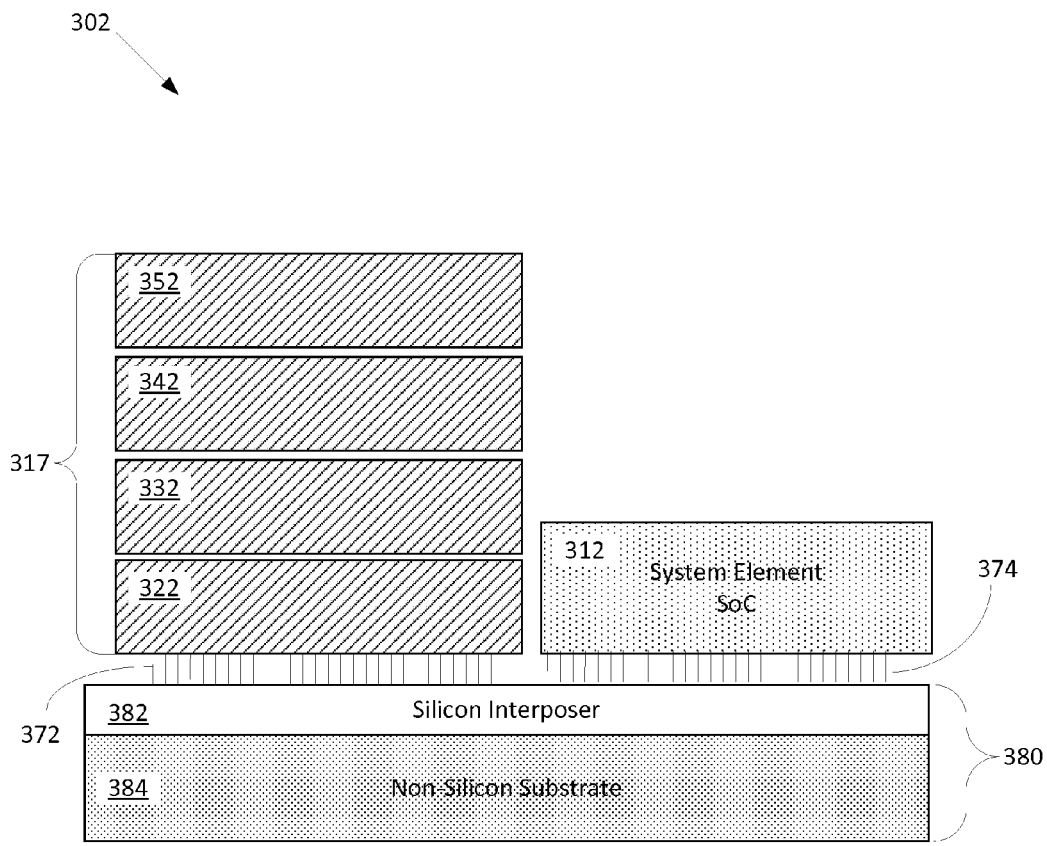
Figure 4:
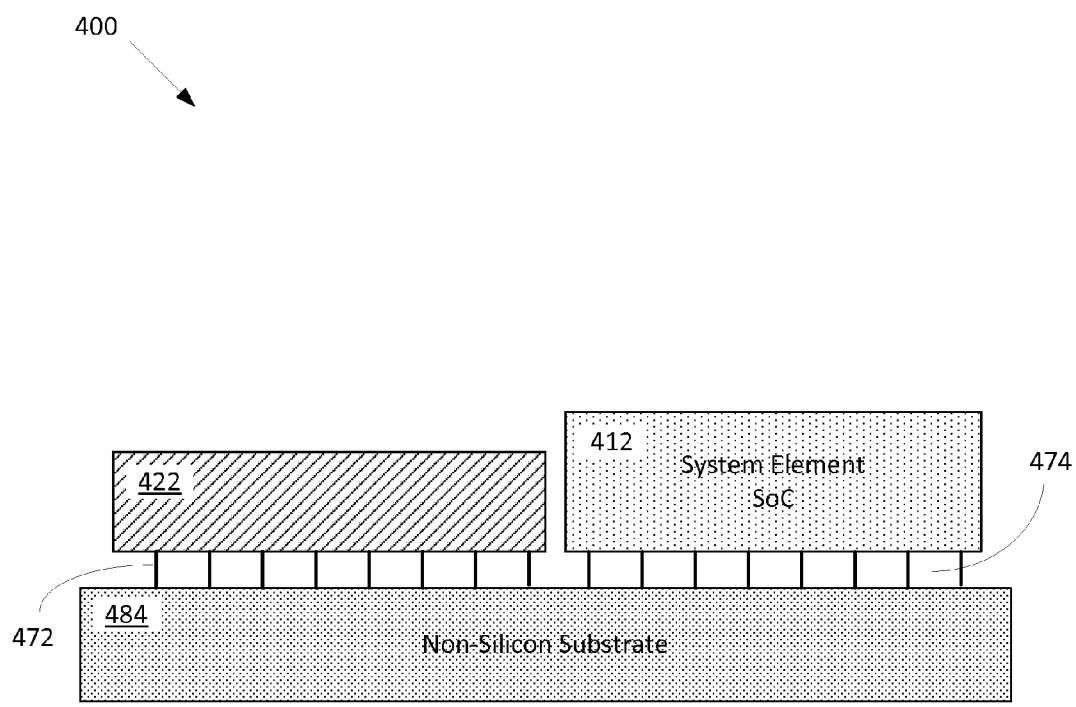

FIGS. 3A, 3B, and 4 illustrate connections for an embodiment of a stacked memory device having varying numbers of memory die layers. In the illustration provided in FIG. 3A, a stacked memory device 300 includes a memory stack 315, where the memory stack in this illustration has four memory die layers, a first memory die layer 320, a second memory die layer 330, a third memory die layer 340, and a fourth memory die layer 350. In this illustration, the memory stack is coupled to a system element 310 by a full number of fine interconnects 370 because sufficient memory die layers are included in the memory stack 315 to require the maximum number of interconnects for the device 300. In some embodiments, the device architecture allows for full memory for high power operations in the configuration shown in FIG. 3A. In some embodiments, the interconnects 370 utilize a pad layout architecture (such as, for example, the pad layout illustrated in FIG. 5) providing spacing between pads required for a smaller memory die to allow for variation in interconnect pitch as the number of memory die layers in a memory stack is varied.

In the illustration provided in FIG. 3B, a stacked memory device 302 includes a memory stack 317 and system element 312 connected via a package substrate 380, where the package substrate may be, for example, a silicon interposer 382 coupled with a non-silicon substrate 384, or a silicon substrate (not illustrated here). In this illustration, the memory stack 317 again includes four memory die layers, a first memory die layer 322, a second memory die layer 332, a third memory die layer 342, and a fourth memory die layer 352. In this illustration, the memory stack 317 and the system element 312 are connected with the substrate 380 by the full number of fine interconnects 372 because again sufficient memory die layers are included in the memory stack 317 to require the maximum number of interconnects for the device 302. In some embodiments, this alternative device architecture may also provide for full memory for high power operations, and interconnects 372 and 374 for the coupling of the memory stack 317 and system element 312 to the silicon interposer 382 or silicon substrate may utilize a pad layout architecture providing spacing between pads required for a smaller memory die to allow for variation in interconnect pitch as the number of memory die layers in a memory stack is varied.

In contrast, FIG. 4 illustrates connections for an embodiment of a stacked memory device having a single memory die layer. In this illustration, a stacked memory device 400 includes a memory die layer 422 connected with a system element 412 through a non-silicon package substrate 484, such as an organic substrate. Embodiments are not limited to this arrangement, and a face of the single memory die layer 422 may also be coupled with a face of the system element 410 in a similar manner to FIG. 3A, or connected using a silicon interposer as illustrated in FIG. 3B. However, the implementation illustrated in FIG. 4 may provide additional cost savings in manufacture. In some embodiments, the stacked memory device 400 includes the memory die layer 422 and the system element 412 coupled to the non-silicon substrate 484 by a reduced number of regular pitch interconnects, interconnects 472 and 474 respectively (wherein such interconnects are thicker than the fine pitch interconnects illustrated in FIGS. 3A and 3B) because a single memory die layer requires only a subset of the maximum number of interconnects for the device 400. In some embodiments, the interconnects 472 and 474 again utilize a pad layout architecture (such as, for example, the pad layout illustrated in FIG. 5) providing spacing between pads required for a smaller number of memory die to allow for variation in interconnect pitch as the number of memory die layers in a memory stack is varied.

In some embodiments, the device architecture illustrated in FIGS. 3A, 3B, and 4 allows both for memory at a lower cost (with cheaper packaging costs), and for memory used in high power operations.

FIG. 5 illustrates an embodiment of a pad layout for stacked memory devices supporting varying pitch of interface connections. In some embodiments, a memory device includes a pad layout 500 for a stacked memory device that provides for spacing between connections to allow for varying pitch interconnections depending on the number of memory die layers in the device. The varying numbers of memory die layers may be, for example, as illustrated in FIGS. 3A, 3B, and 4.

In some embodiments, the pad layout 500 may include the connections required for memory operation, including data connection (DQ0 through DQ 4) and power connections (VSS, VSS Q, VDD Q, and VDD 2 in this illustration). In some embodiments, each memory die layer drives a subset of the memory interconnect of the device, thus allowing for a reduction in the number of interconnects if there is reduction in the number of memory die layers. In some embodiments, the pad layout is structured so that the active pads required for interconnection of a single memory die device (which are, for example, the shaded pads 510 in FIG. 5) are spaced a minimum of one pad width in each direction. In some embodiments, the pad layout architecture 500 allows for a first interconnect pitch for connection of a larger number of memory die layers (such as a maximum number of memory die layers requiring all of the pads of the pad layout architecture 500) and for a second interconnect pitch for a partial pad layout of the pads 510 required for few memory die layers, such as a single memory die layer.

Figure 6:
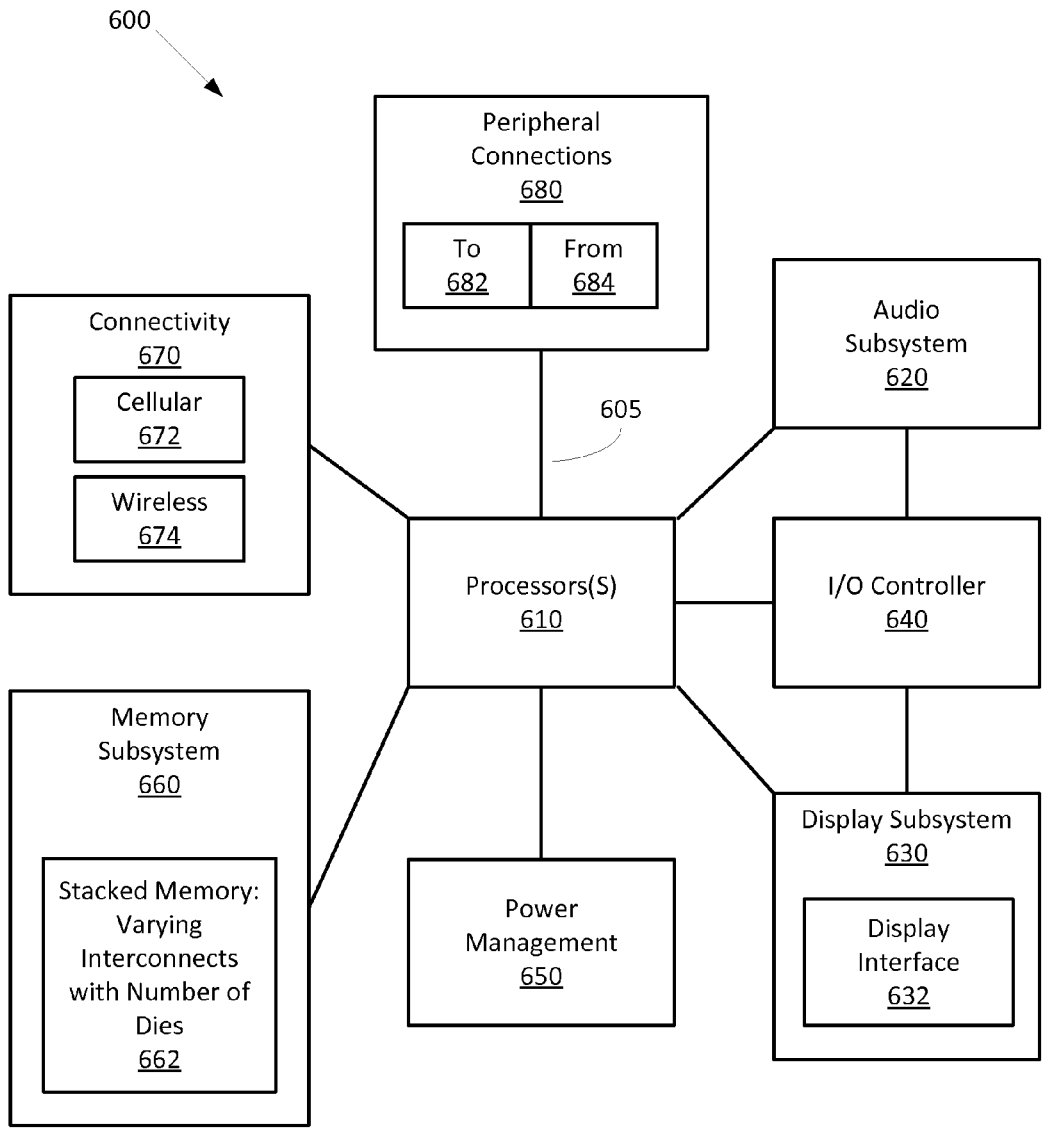
FIG. 6 is a block diagram to illustrate an embodiment of an apparatus or system including a stacked memory device.

A stacked memory may be utilized in many different computing environments, depending on the number of memory die layers in a memory device. FIG. 6 is a block diagram to illustrate an embodiment of an apparatus or system including a stacked memory device. Computing device 600 represents a computing device including a mobile computing device, such as a laptop, a computing tablet, a mobile phone or smartphone, a wireless-enabled e-reader, or other wireless mobile device. It will be understood that certain of the components are shown generally, and not all components of such a device are shown in device 600. The components may be connected by one or more buses or other connections 605.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, display subsystem 630, or both such subsystems. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as system data (whether long-term or temporary) related to the execution of the applications and functions of system 600.

In some embodiments, the memory subsystem 660 may include a stacked memory device 662, such as illustrated in FIGS. 1 through 5, where the stacked memory device includes one or more memory die layers and a system element. In some embodiments, the stacked memory device 662 provides for varying interconnects based on a number of memory die layers, allowing for use of wider pitch interconnects in devices utilizing a smaller number of memory dies.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as WiFi), wide area networks (such as WiMax), and other wireless communications.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:
    a system element for the memory device, the system element including a plurality of pads; and
    a memory stack connected with the system element, the memory stack including one or more memory die layers, a connection of the system element and the memory stack including a plurality of interconnects for connecting a first memory die layer and the plurality of pads of the system element;
    wherein for a single memory die layer in the memory stack, a first subset of the plurality of pads is utilized for a first group of interconnects for the connection of the system element and the memory stack, wherein the first subset of the plurality of pads are spaced such that at least one pad is located between each pad of the first subset of pads; and
    wherein for two or more memory die layers in the memory stack, the first subset and an additional second subset of the plurality of pads are utilized for the first group of interconnects and a second group of interconnects for the connection of the system element and the memory stack.

2. The memory device of claim 1, wherein the single memory die layer is the sole memory die layer in the memory stack, and wherein a first pitch of interconnect is used for the interconnects of the first memory die layer and the system element.

3. The memory device of claim 1, wherein two or more memory die layers are present in the memory stack and wherein a second pitch of interconnect is used for the interconnects of the first memory die layer and the system element, a first pitch of interconnect used for a sole memory die layer being greater than the second pitch of interconnect.

4. The memory device of claim 1, wherein the memory device is structured for a subset of a total logic memory interconnect between the memory stack and the system element of the memory device to be driven from each memory die layer.

5. The memory device of claim 1, wherein the number of memory die layers is a maximum number of memory die layers for the memory stack, and wherein all of the pads of the plurality of pads are used for interconnects.

6. The memory device of claim 1, wherein the system element is a system on chip (SoC).

7. A system comprising:
    a bus;
    a stacked memory device coupled to the bus; and a processor coupled to the bus, the processor to read data from and write data to the stacked memory device;

wherein the stacked memory device includes:
- a system element for the stacked memory device, the system element including a plurality of pads, and
- a memory stack connected with the system element, the memory stack including one or more memory die layers, a connection of the system element and the memory stack including a plurality of interconnects for connecting a first memory die layer and the plurality of pads of the system element;
- wherein for a single memory die layer in the memory stack, a first subset of the plurality of pads is utilized for a first group of interconnects for the connection of the system element and the memory stack, wherein the first subset of the plurality of pads are spaced such that at least one pad is located between each pad of the first subset of pads; and
- wherein for two or more memory die layers in the memory stack, the first subset and an additional second subset of the plurality of pads are utilized for the first group of interconnects and a second group of interconnects for the connection of the system element and the memory stack.

8. The system of claim 7, wherein the single memory die layer is the sole memory die layer in the memory stack, and wherein a first pitch of interconnect is used for the interconnects between the first memory die layer and the system element.

9. The system of claim 7, wherein two or more die layers are present in the memory stack and wherein a second pitch of interconnect is used for the interconnects if a certain number of memory die layers are present in the memory stack, the certain number being two or greater, a first pitch of interconnect used for a sole memory die layer being greater than the second pitch of interconnect.

10. The system of claim 7, wherein the memory device is structured for a subset of a total logic memory interconnect between the memory stack and the system element of the memory device to be driven from each memory die layer.

11. A memory device comprising:
- a system element for the memory device, the system element including a plurality of pads;
- a memory stack connected with the system element, the memory stack including one or more memory die layers, a connection of the system element and the memory stack including a plurality of interconnects for connecting a first memory die layer and the plurality of pads of the system element; and
- a silicon interposer, the connection including a coupling of the system element and memory stack to the silicon interposer;
- wherein for a single memory die layer in the memory stack, a first subset of the plurality of pads is utilized for a first group of interconnects for the connection of the system element and the memory stack; and
- wherein for two or more memory die layers in the memory stack, the first subset and an additional second subset of the plurality of pads are utilized for the first group of interconnects and a second group of interconnects for the connection of the system element and the memory stack.

12. A memory device comprising:
- a system element for the memory device, the system element including a plurality of pads;
- a memory stack connected with the system element, the memory stack including one or more memory die layers, a connection of the system element and the memory stack including a plurality of interconnects for connecting a first memory die layer and the plurality of pads of the system element; and
- a non-silicon package substrate, the memory stack including a single memory die layer, and the connection including a coupling of the system element and the single memory die layer to the non-silicon package substrate;
- wherein for a single memory die layer in the memory stack, a first subset of the plurality of pads is utilized for a first group of interconnects for the connection of the system element and the memory stack; and
- wherein for two or more memory die layers in the memory stack, the first subset and an additional second subset of the plurality of pads are utilized for the first group of interconnects and a second group of interconnects for the connection of the system element and the memory stack.

* * * * *